United States Patent
Tuers et al.

(10) Patent No.: US 9,431,120 B1
(45) Date of Patent: Aug. 30, 2016

(54) MEMORY DIE AND METHOD FOR EFFICIENT USE OF DATA LATCHES IN SERVING MIXED TRAFFIC LOADS

(71) Applicant: SanDisk Technologies Inc., Plano, TX (US)

(72) Inventors: Daniel E. Tuers, Kapaa, HI (US); Anne Pao-Ling Koh, Fremont, CA (US); Abhijeet Manohar, Bangalore, IN (US)

(73) Assignee: SanDisk Technologies, LLC, Plano, TX (US)

( * ) Notice: Subject to any disclaimer, the term of this patent is extended or adjusted under 35 U.S.C. 154(b) by 0 days.

(21) Appl. No.: 14/665,920

(22) Filed: Mar. 23, 2015

(51) Int. Cl.
  *G11C 16/04* (2006.01)
  *G11C 16/26* (2006.01)
  *G11C 16/10* (2006.01)
  *G11C 11/16* (2006.01)
  *G11C 11/56* (2006.01)

(52) U.S. Cl.
  CPC ............... *G11C 16/26* (2013.01); *G11C 11/16* (2013.01); *G11C 11/5628* (2013.01); *G11C 16/10* (2013.01); *G11C 16/0483* (2013.01)

(58) Field of Classification Search
  CPC ... G11C 16/26; G11C 16/10; G11C 16/0483; G11C 11/16; G11C 11/5628
  USPC .................. 365/185.12, 185.05, 189.08
  See application file for complete search history.

(56) References Cited

U.S. PATENT DOCUMENTS

| | | | | |
|---|---|---|---|---|
| 8,429,330 B2* | 4/2013 | Wan | ............. | G06F 12/0246 711/103 |
| 8,743,615 B2* | 6/2014 | Lee | ............. | G11C 16/3427 365/185.02 |
| 9,009,398 B2* | 4/2015 | Avila | ............. | G06F 12/0246 711/103 |
| 9,053,790 B1* | 6/2015 | Hu | ............. | G11C 13/0069 |
| 9,124,300 B2* | 9/2015 | Sharon | ............. | G06F 11/1012 |

* cited by examiner

*Primary Examiner* — Pho M Luu
(74) *Attorney, Agent, or Firm* — Brinks Gilson & Lione (57) ABSTRACT

A memory die is provided comprising a non-volatile memory organized in physical pages, a transfer data latch in communication with the non-volatile memory, at least one auxiliary data latch in communication with the transfer data latch, and circuitry. The circuitry is configured to receive a plurality of sense commands, wherein each sense command indicates a physical page in the non-volatile memory to be sensed and a portion of the physical page to be stored in the at least one auxiliary data latch. For each sense command, the circuitry is configured to store data from the physical page sensed by the sense command in the transfer data latch and move data from the portion of the physical page indicated by the sense command to an available location in the at least one auxiliary data latch.

24 Claims, 7 Drawing Sheets

MEMORY DIE AND METHOD FOR EFFICIENT USE OF DATA LATCHES IN SERVING MIXED TRAFFIC LOADS

BACKGROUND

A memory die typically has one or more data latches used in the process of writing data to and reading data from non-volatile memory in the memory die. In memory systems with multiple dies, the use of the data latches allows one die to sense data and store it in a data latch for a later transfer, while data is being transferred out of another memory die. However, during mixed traffic loads where there are both long sequential reads/writes and short fragment reads/writes, memory dies performing the short fragment reads/writes need to be idle until the long sequential reads/writes are completed. To increase memory die efficiency, the memory dies performing the short fragment reads/writes can be provided with more read/write requests to keep them busy while they are waiting for other memory dies to finish and release the data bus going to the controller. However, many current architectures limit the number of read commands to one. Further, the queue depth to hold data from those additional commands is limited to the number of data latches in the memory die.

DETAILED DESCRIPTION OF THE PRESENTLY PREFERRED EMBODIMENTS

Overview

Embodiments of the present invention are defined by the claims, and nothing in this section should be taken as a limitation on those claims.

By way of introduction, the below embodiments relate to a memory die and method for efficient use of data latches in serving mixed traffic loads. In one embodiment, a memory die is provided comprising a non-volatile memory organized in physical pages, a transfer data latch in communication with the non-volatile memory, at least one auxiliary data latch in communication with the transfer data latch, and circuitry. The circuitry is configured to receive a plurality of sense commands, wherein each sense command indicates a physical page in the non-volatile memory to be sensed and a portion of the physical page to be stored in the at least one auxiliary data latch. For each sense command, the circuitry is configured to store data from the physical page sensed by the sense command in the transfer data latch and move data from the portion of the physical page indicated by the sense command to an available location in the at least one auxiliary data latch.

In another embodiment, a method for using data latches in a memory die is provided. In this embodiment, the memory die receives a plurality of sense commands, wherein each sense command indicates a physical page in the non-volatile memory to be sensed and a portion of the physical page to be stored in the second data latch. For each sense command, the memory die stores data from the physical page sensed by the sense command in the first data latch and moves data from the portion of the physical page indicated by the sense command to an available location in the second data latch.

In yet another embodiment, a memory die is provided comprising a non-volatile memory organized in physical pages, a first data latch configured to store a page of data sensed from one of the physical pages of the non-volatile memory, a second data latch, and a data latch control module. The data latch control module is configured to move only a portion of the data from the first data latch to an available location in the second data latch, wherein the portion is indicated in a sense command.

In some embodiments, each sense command indicates the portion of the physical page by indicating an offset and a length.

In some embodiments, the transfer (first) data latch and the at least one auxiliary (second) data latch are organized in tiers, and data is moved from the transfer data latch to an available location in the at least one auxiliary data latch irrespective of whether the data would be moved to a different tier. In other embodiments, data is moved between corresponding tiers. In some embodiments, the data can be moved using an input-output module.

In some embodiments, the memory is a three-dimensional memory, and, in some embodiments, the memory die is embedded in a host or is part of a memory system that is removably connected to a host.

Other embodiments are possible, and each of the embodiments can be used alone or together in combination. Accordingly, various embodiments will now be described with reference to the attached drawings.

EXEMPLARY EMBODIMENTS

As mentioned in the background section above, during mixed traffic loads where there are both long sequential reads/writes and short fragment reads/writes, memory dies performing the short fragment reads/writes need to be idle until the long sequential reads/writes are completed. To increase memory die efficiency, the memory dies performing the short fragment reads/writes can be provided with more read/write requests to keep them busy while they are waiting for other memory dies to finish and release the data bus going to the controller. However, many current architectures limit the number of read commands to one. Further, the queue depth to hold data from those additional commands is limited to the number of data latches in the memory die. The following embodiments can be used to address this problem. Before turning to these and other embodiments, the following paragraphs provide a discussion of exemplary memory systems that can be used with these embodiments. Of course, these are just examples, and other suitable types of memory systems can be used.

Figures 1A, 1B:
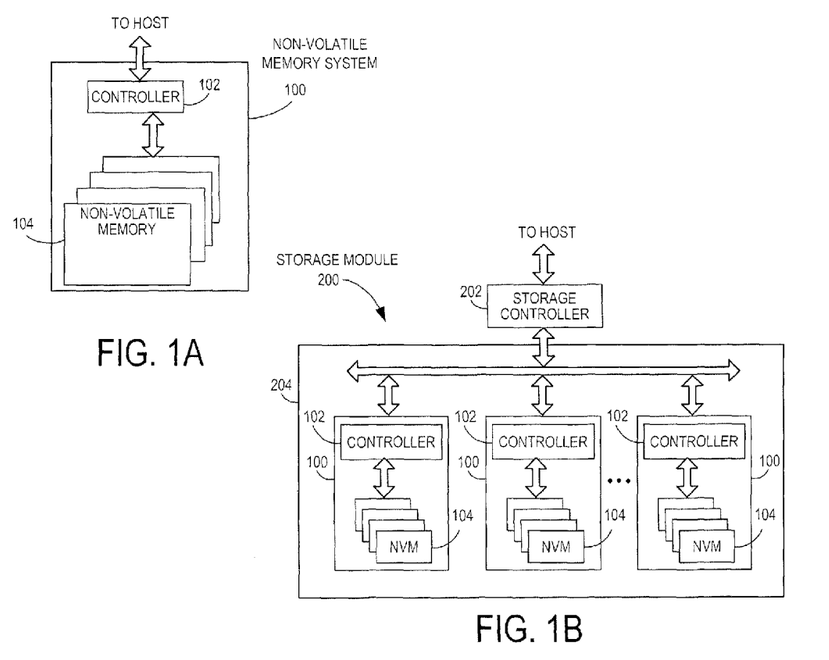
FIG. 1A is a block diagram of a non-volatile memory system of an embodiment.
FIG. 1B is a block diagram illustrating an exemplary storage module of an embodiment.
Figure 1C:
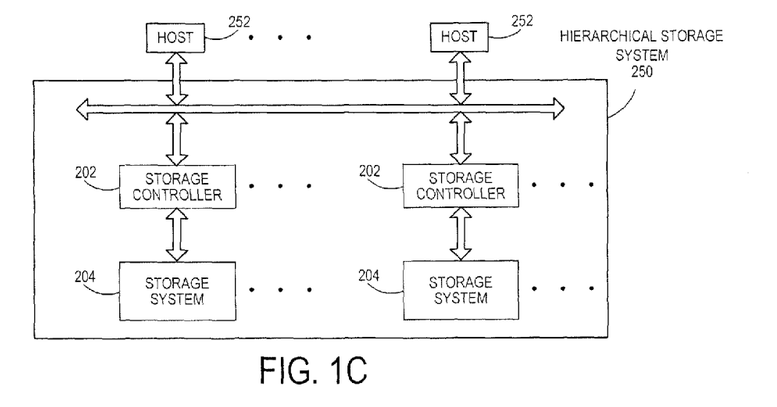
FIG. 1C is a block diagram illustrating a hierarchical storage system of an embodiment.

Memory systems suitable for use in implementing aspects of these embodiments are shown in FIGS. 1A-1C. FIG. 1A is a block diagram illustrating a non-volatile memory system according to an embodiment of the subject matter described herein. Referring to FIG. 1A, non-volatile memory system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system.

Although, in the example illustrated in FIG. 1A, non-volatile memory system 100 (sometimes referred to herein as a storage module) includes a single channel between controller 102 and non-volatile memory die 104, the subject matter described herein is not limited to having a single memory channel. For example, in some NAND memory system architectures (such as the ones shown in FIGS. 1B and 1C), 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be an NVMe or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
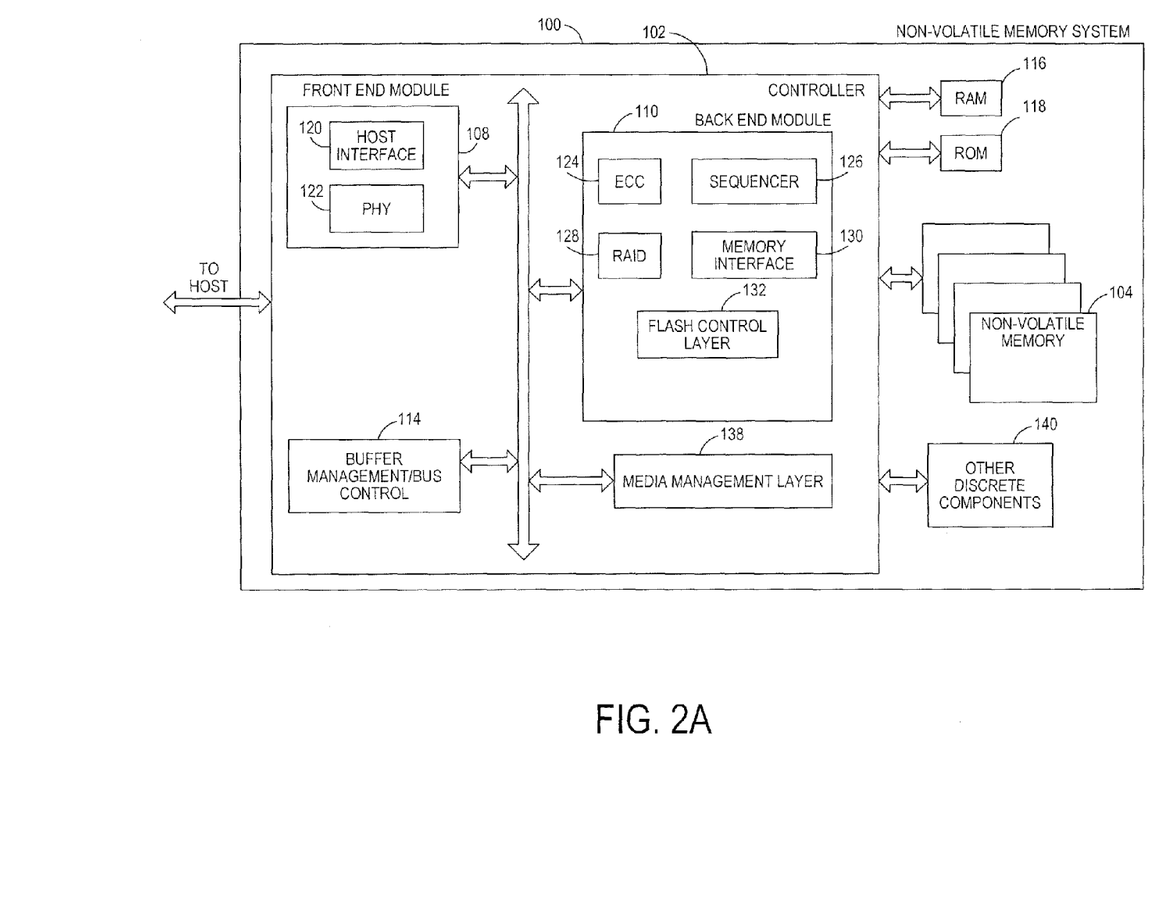
FIG. 2A is a block diagram illustrating exemplary components of the controller of the non-volatile memory system illustrated in FIG. 1A according to an embodiment.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include media management layer 138, which performs wear leveling of memory cells of non-volatile memory die 104. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
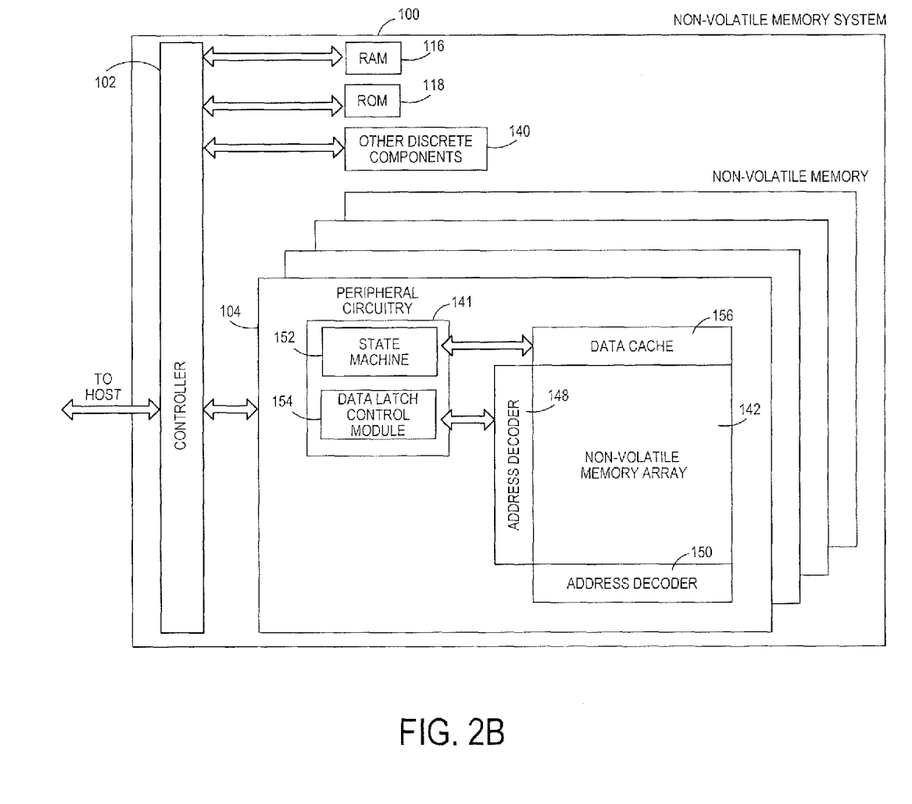
FIG. 2B is a block diagram illustrating exemplary components of the non-volatile memory of the non-volatile memory storage system illustrated in FIG. 1A according to an embodiment.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. In one embodiment, the peripheral circuitry 141 also includes a data latch control module 154 configured to move only a portion of the data from a first data latch to an available location in a second data latch. This module will be discussed in more detail below. Non-volatile memory die 104 further includes a data cache 156 that caches data.

Figure 3:
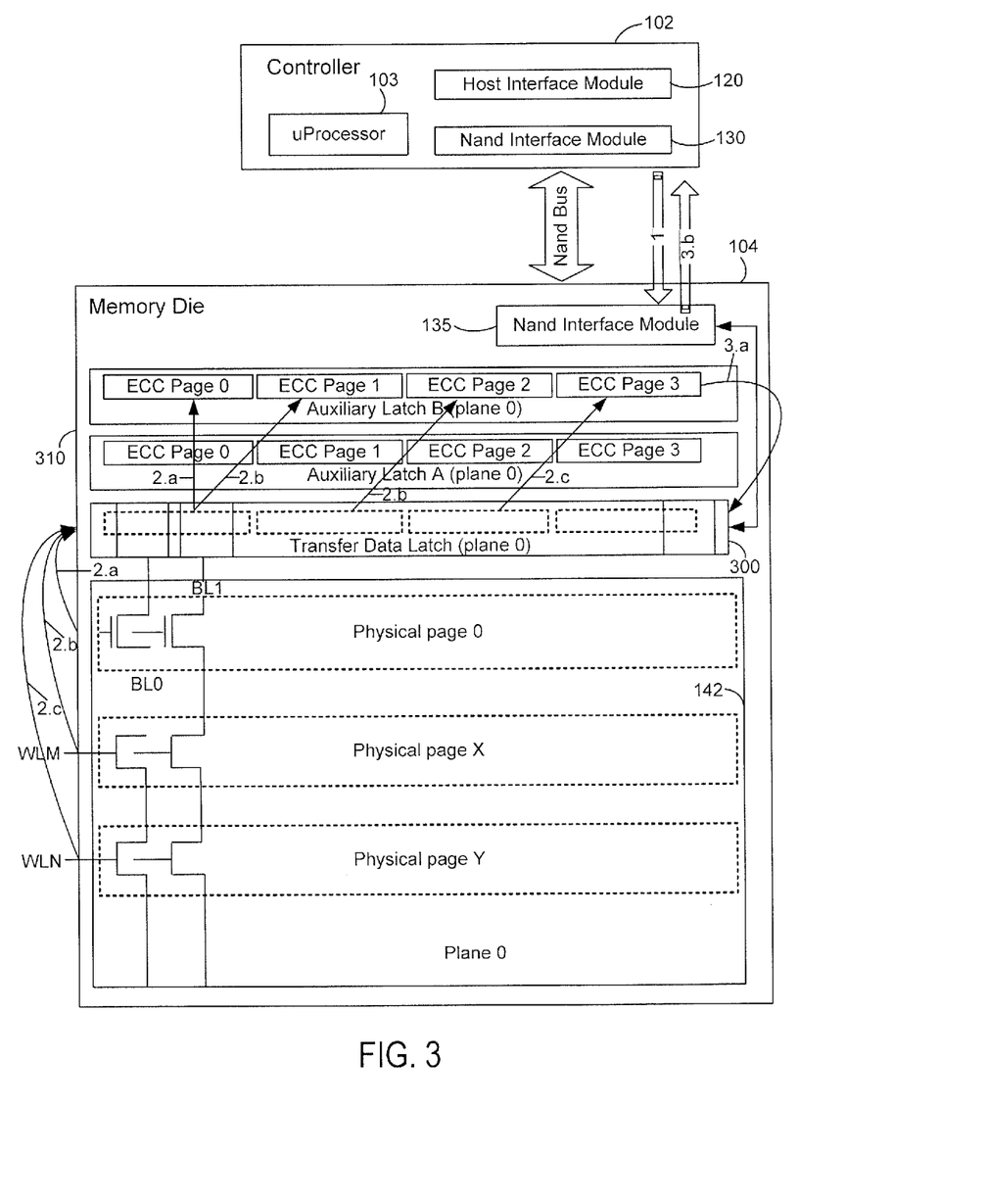
FIG. 3 is an illustration of a memory die and controller of an embodiment.

FIG. 3 is a diagram that illustrates the use of the data cache 156 in more detail. As shown in FIG. 3, the data cache 156 in this embodiment comprises a transfer data latch 300 (sometimes referred to as a "first data latch") used to transfer data between the controller 102 (using the NAND interface modules 130, 135) and the memory die 104 and at least one auxiliary data latch (sometimes referred to as a "second data latch") used to store data to be written to or read from the non-volatile memory 142, which is organized in physical pages.

During a read operation, the microprocessor 103 in the controller 102 sends a plurality of sense commands to the memory die 104. Typically, the circuitry 141 (see FIG. 2B) would sense the physical page indicated by the command and store the data in the transfer data latch 300. That entire page of data can then be moved to the auxiliary data latch 310, so the transfer data latch 300 can be used for another read or write operation. At some point, the data is moved from the auxiliary data latch 310 back to the transfer data latch 300, and the controller 102 reads out the portions of the data that it is interested in. Because the number of the auxiliary data latches 310 is limited, the memory die 102 is only able to store data from a limited number of physical pages.

This embodiment recognizes that more data can be stored in the auxiliary data latch 310 if, instead of storing the entire page of data in the auxiliary data latch 310, the memory die 104 only stores those portion(s) of the page that the controller 102 will eventually want to read out. For example, if a physical page stores four error correction code (ECC) pages (of data and ECC bits) but the controller 102 will only want to read out one of those ECC pages, 75% of the auxiliary data latch 310 will be used to store data that the controller 102 will not read out.

To make storing data in the auxiliary data latch 310 more efficient, instead of the controller 102 sending a sense command that merely indicates which physical page is to be read, the sense command indicates which portion of the physical page should be stored in the auxiliary data latch 310. For example, the sense command can identify not only the physical page to be read but also an offset and a length of the data to be stored in the auxiliary data latch 310. When the memory die 104 receives such a sense command (act 1 in FIG. 3), the memory die 104 (e.g., the circuitry 141, the data latch control module 154, or another component in the memory die 104) senses the physical page indicated by the command and stores the data from the physical page in the transfer data latch 300. Then, the memory die 104 moves data from the portion of the physical page indicated by the sense command to an available location in the auxiliary data latch 310.

For example, consider the situation in which three sense commands are sent to the memory die 104. Sense command "a" indicates that physical page 0 is to be sensed and that 1 ECC page worth of data at offset 0 should be stored in the auxiliary data latch 310. Sense command "b" indicates that physical page x is to be sensed and that 2 ECC pages worth of data at offset 0 should be stored in the auxiliary data latch 310. Sense command "c" indicates that physical page y is to be sensed and that 1 ECC page worth of data at offset 2 should be stored in the auxiliary data latch 310. In this example, a physical page is 16 KB, and each ECC page is 4 KB. Of course, this is only an example, and other configurations can be used.

As shown by the 2a arrows in FIG. 3, when sense command "a" is executed, physical page 0 is read into the transfer data latch 300, but only the first ECC page needs to be stored in the auxiliary data latch 310 (because only the first ECC page at offset 0 is needed). The memory die 104 determines an available location and stores that ECC page in the auxiliary data latch 310. Here, the ECC page is moved to the same tier auxiliary data latch 310 as the tier that stored the data in the transfer data latch 300. As shown by the 2b arrows in FIG. 3, when sense command "b" is executed, physical page x is read into the transfer data latch 300, but only the first two ECC pages needs to be stored in the auxiliary data latch 310 (because only the first two ECC pages at offset 0 are needed). The memory die determines an available location and stores those ECC pages in the auxiliary data latch 310. Here, the ECC pages are stored in different tiers than in the transfer data latch 300 because the first tier has already been filled with the ECC page from command "a." Lastly, as shown by the 2c arrows in FIG. 3, when sense command "c" is executed, physical page y is read into the transfer data latch 300, but only the first ECC page at offset 2 needs to be stored in the auxiliary data latch 310. The memory die determines an available location and stores those ECC pages in the auxiliary data latch 310, which, again, is in a different tier. When the bus to the controller 102 is free for communication, the memory die 104 transfers the data stored in the auxiliary data latch 310 to the transfer data latch 300, so the data can be transferred to the controller 102 in the order in which the transfer data latch 300 was packed (arrow 3a), although a different order can be used.

In this example, three senses take place and fill one auxiliary data latch 310 in the order in which the sense commands were executed (although a different order can be used). This example can be extended to pack many more of the auxiliary data latches 310 in such a manner that the memory die 104 stays busy sensing and packing the auxiliary data latches 310 until the bus to the controller 103 is free for communication again.

Figure 4:
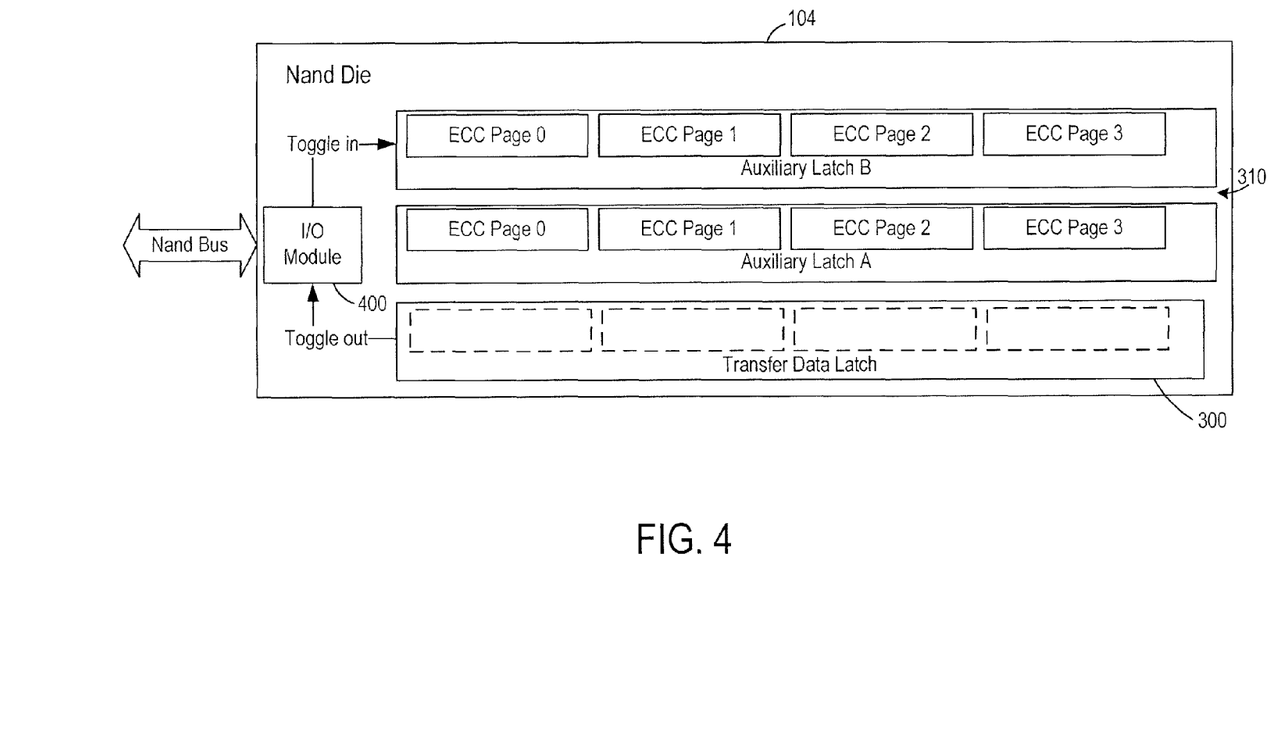
FIG. 4 is an illustration of a memory die of an embodiment with an input-output module.
Figure 5:
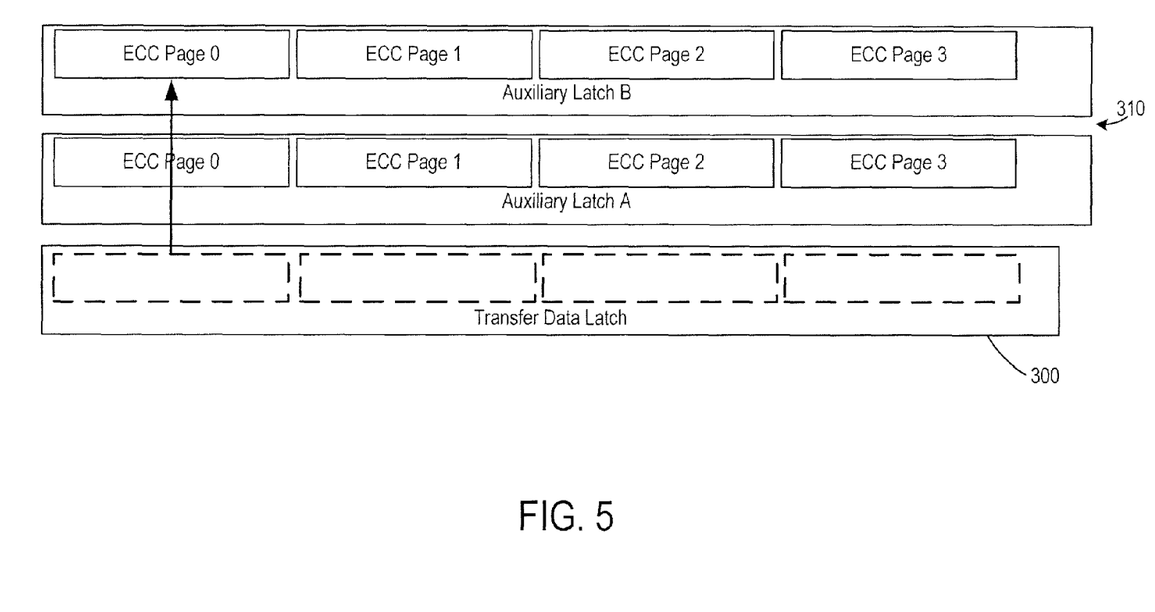
FIG. 5 is an illustration of a memory die of an embodiment that moves data within a tier.

In the above example, the transfer data latch 300 and the auxiliary data latch 310 were organized in tiers, and the data was moved from the transfer data latch 300 to an available location in the auxiliary data latch 310 irrespective of whether the data would be moved to a different tier. As shown in FIG. 4, this can be accomplished by using an input-output module 400. Here, there would be not alignment or codeword restrictions. However, in some architectures, moving data between tiers may be difficult (e.g., because of the very small scale of the inter-silicon connections). In that situation (shown in FIG. 5), data can be moved between corresponding tiers in the transfer data latch 300 and the auxiliary data latch 310. Here, a tier-to-tier copy operation can be allowed if the copy operation is aligned. Aligning codewords with tiers can result in a faster copy operation. The latency involved in this operation is virtually inconsequential because, compared to not doing the operation, the die utilization drops to zero after two operations (the current operation and the cache operation).

Figure 6:
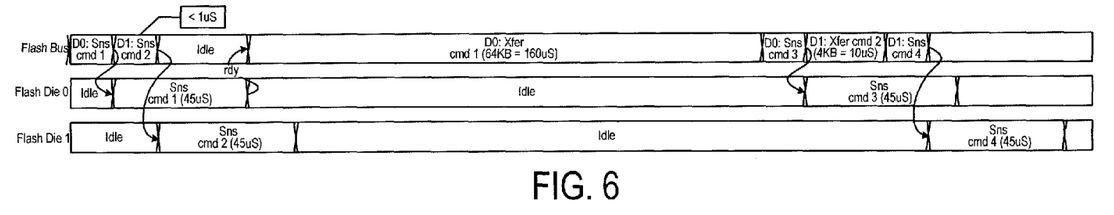
FIG. 6 is an illustration of an embodiment that does not use a read cache.
Figure 7:
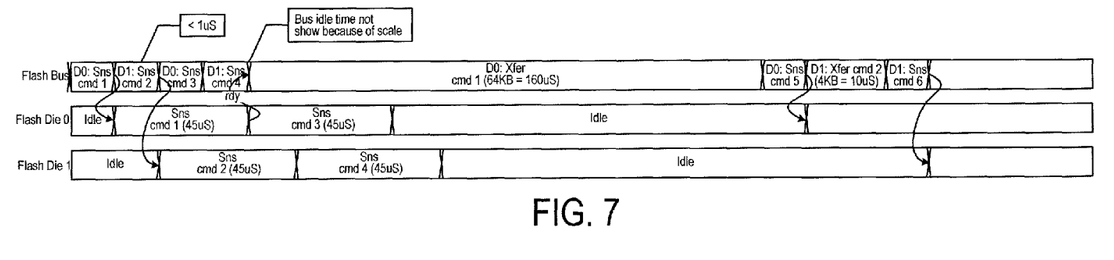
FIG. 7 is an illustration of an embodiment that uses a read cache.
Figure 8:
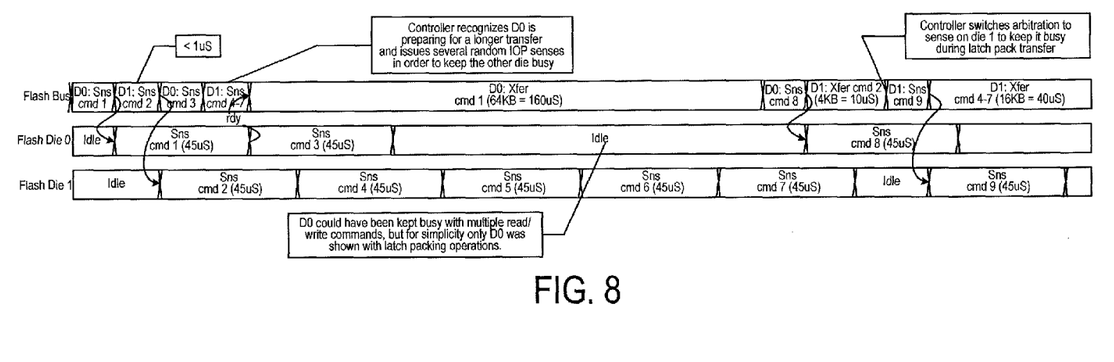
FIG. 8 is an illustration of an embodiment that uses a read cache and also uses data latch packing.

There are several advantages associated with these embodiments. For example, packing the auxiliary data latch 310 in an efficient manner effectively increases the command queue depth and allows each auxiliary data latch 310 to be fully utilized. The improvement can be measurable on a two-die system as well as systems with many more than two dies (e.g., 8+ dies). Packing the auxiliary data latch 310 avoids latch swap functions in transferring the data to the controller 102. This allows several commands to the flash bus that are larger than the cache depth and queue depth. As shown by FIGS. 6-8, these embodiments can be used to improve die utilization and read performance in "mixed traffic" environments where there are both long sequential reads/writes and short fragment reads/writes.

FIG. 6 shows activity on the memory bus and two memory dies. Here, there is no read cache, and only one latch is used. When the sense commands are sent to die 0 and die 1, both dies go busy. Die 0 finishes first and sends its data over the bus. Because the transfer is relatively long, the bus is tied up with the data transfer even after die 1's operations are complete. The means that both dies are idle for a relatively long time while the data transfer from die 0 takes place.

FIG. 7 shows a situation in which a traditional read cache is used. Here, because there is a read cache (e.g., an auxiliary data cache), multiple sense commands can be sent to each die. That way, the memory dies can perform an additional read operation (and store the sensed data in the auxiliary data cache) while waiting for the bus to become free. While the idle time for both dies is less than in FIG. 6, it is still relatively significant. This is especially true during mixed traffic loads where there are both long sequential reads/writes and short fragment reads/writes, as memory dies performing the short fragment reads/writes need to be idle until the long sequential reads/writes are completed. Even with a read cache in this example, the queue depth to hold data from additional commands is limited to the number of data latches in the memory die. FIG. 8 shows a situation in which the present embodiments are used. Here, instead of just sending two sense commands to die 1, as in FIG. 7, seven commands are sent, since the data can be packed into the latches more efficiently. As can be seen in FIG. 8, this dramatically reduces the time that die 1 is idle.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A memory die comprising:
   a non-volatile memory organized in physical pages;
   a transfer data latch in communication with the non-volatile memory;
   at least one auxiliary data latch in communication with the transfer data latch; and
   circuitry in communication with the non-volatile memory, the transfer data latch, and the at least one auxiliary data latch, wherein the circuitry is configured to:
      receive a plurality of sense commands, wherein each sense command indicates a physical page in the non-volatile memory to be sensed and a portion of the physical page to be stored in the at least one auxiliary data latch; and
      for each sense command:
         store data from the physical page sensed by the sense command in the transfer data latch; and
         move data from the portion of the physical page indicated by the sense command to the at least one auxiliary data latch.

2. The memory die of claim 1, wherein each sense command indicates the portion of the physical page by indicating an offset and a length.

3. The memory die of claim 1, wherein the transfer data latch and the at least one auxiliary data latch are organized in tiers, and wherein data is moved from the transfer data latch to the at least one auxiliary data latch irrespective of whether the data would be moved to a different tier.

4. The memory die of claim 1, wherein the transfer data latch and the at least one auxiliary data latch are organized in tiers, and wherein data is moved between corresponding tiers in the transfer data latch and the at least one auxiliary data latch.

5. The memory die of claim 1, wherein the data is moved from the transfer data latch to the at least one auxiliary data latch using an input-output module.

6. The memory die of claim 1, wherein the non-volatile memory is a three-dimensional memory.

7. The memory die of claim 1, wherein the memory die is embedded in a host.

8. The memory die of claim 1, wherein the memory die is part of a memory system that is removably connected to a host.

9. A method comprising:
receiving a plurality of sense commands, wherein each sense command indicates a physical page in a non-volatile memory of a memory die having a first data latch and a second data latch to be sensed and a portion of the physical page to be stored in the second data latch; and
for each sense command:
latching data from the physical page sensed by the sense command in the first data latch; and
moving data from the portion of the physical page indicated by the sense command to the second data latch.

10. The method of claim 9, wherein each sense command indicates the portion of the physical page by indicating an offset and a length.

11. The method of claim 9, wherein the first and second data latches are organized in tiers, and wherein data is moved from the first data latch to the second data latch irrespective of whether the data would be moved to a different tier.

12. The method of claim 9, wherein the first and second data latches are organized in tiers, and wherein data is moved between corresponding tiers in the first and second data latches.

13. The method of claim 9, wherein the data is moved from the first data latch to the second data latch using an input-output module.

14. The method of claim 9, wherein the non-volatile memory is a three-dimensional memory.

15. The method of claim 9, wherein the memory die is embedded in a host.

16. The method of claim 9, wherein the memory die is part of a memory system that is removably connected to a host.

17. A memory die comprising:
a non-volatile memory organized in physical pages;
a first data latch configured to buffer a page of data sensed from one of the physical pages of the non-volatile memory;
a second data latch; and
a data latch control module in communication with the non-volatile memory and the first and second data latches, wherein the data latch control module is configured to transfer some but not all of the data from the first data latch to the second data latch.

18. The memory die of claim 17, wherein the data to be transferred is indicated by an offset and a length in a sense command.

19. The memory die of claim 17, wherein the first and second data latches are organized in tiers, and wherein data is transferred from the first data latch to the second data latch irrespective of whether the data would be transferred to a different tier.

20. The memory die of claim 17, wherein the first and second data latches are organized in tiers, and wherein data is transferred between corresponding tiers in the first and second data latches.

21. The memory die of claim 17, wherein the data is transferred from the first data latch to the second data latch using an input-output module.

22. The memory die of claim 17, wherein the non-volatile memory is a three-dimensional memory.

23. The memory die of claim 17, wherein the memory die is embedded in a host.

24. The memory die of claim 17, wherein the memory die is part of a memory system that is removably connected to a host.

* * * * *